United States Patent [19]

Lin et al.

[11] Patent Number: 4,675,346

[45] Date of Patent: * Jun. 23, 1987

[54] UV CURABLE SILICONE RUBBER COMPOSITIONS

[75] Inventors: Samuel Q. S. Lin, S. Windsor; Steven T. Nakos, Andover, both of Conn.

[73] Assignee: Loctite Corporation, Newington, Conn.

[*] Notice: The portion of the term of this patent subsequent to Jul. 9, 2002 has been disclaimed.

[21] Appl. No.: 571,036

[22] Filed: Jan. 16, 1984

Related U.S. Application Data

[63] Continuation-in-part of Ser. No. 505,588, Jun. 20, 1983, Pat. No. 4,477,326, which is a continuation-in-part of Ser. No. 528,287, Aug. 31, 1983, Pat. No. 4,587,276, which is a continuation-in-part of Ser. No. 509,568, Jun. 30, 1983, abandoned, which is a continuation-in-part of Ser. No. 515,702, Jul. 20, 1983, Pat. No. 4,504,629, which is a continuation-in-part of Ser. No. 538,624, Oct. 3, 1983, Pat. No. 4,528,081.

[51] Int. Cl.$^4$ .................... C08F 20/20; C08F 20/26; C08F 30/08; C08F 2/50
[52] U.S. Cl. .................... 522/39; 522/14; 522/35; 522/40; 522/43; 522/46; 522/78; 522/83; 522/99; 524/854; 526/279
[58] Field of Search .................... 204/159.13; 522/39, 522/34, 40, 43, 46, 78, 83, 99

[56] References Cited

U.S. PATENT DOCUMENTS

| | | | |
|---|---|---|---|
| 4,158,617 | 6/1979 | Eldred | 204/159.13 |
| 4,201,808 | 5/1980 | Cully et al. | 204/159.13 |
| 4,227,979 | 10/1980 | Humke | 204/159.13 |
| 4,293,397 | 10/1981 | Sato et al. | 204/159.13 |
| 4,348,454 | 9/1982 | Eckberg | 204/159.13 |
| 4,364,809 | 12/1982 | Sato et al. | 204/159.13 |
| 4,477,326 | 10/1984 | Lin | 204/159.13 |
| 4,504,629 | 3/1985 | Lien et al. | 525/288 |
| 4,528,081 | 7/1985 | Lien et al. | 204/159.23 |

FOREIGN PATENT DOCUMENTS 2039287 8/1980 United Kingdom.

*Primary Examiner*—John C. Bleutge
*Assistant Examiner*—A. H. Koeckert
*Attorney, Agent, or Firm*—Walter J. Steinkraus; Eugene F. Miller

[57] ABSTRACT

Compositions of (a) a silicone resin characterized by an intermediate region free of acrylic groups, at least 150 siloxane units long, and terminal acrylic groups; (b) at least 10% of a fumed silica filler; and (c) a photoinitiator, can be cured by UV irradiation to tough elastomeric materials useful in adhesive and sealant applications.

19 Claims, No Drawings

UV CURABLE SILICONE RUBBER COMPOSITIONS

This application is a continuation in part of each of the copending applications Ser. Nos. 505,588, filed June 20, 1983, now U.S. Pat. No. 4,477,326; 528,287, filed Aug. 31, 1983 now U.S. Pat. No. 4,587,276; 509,568, filed June 30, 1983, now abandoned; 515,702, filed July 20, 1983, now U.S. Pat. No. 4,504,629; and 538,624 filed Oct. 3, 1983, now U.S. Pat. No. 4,528,081, all assigned to Loctite Corporation, Newington, CT.

BACKGROUND OF THE INVENTION

This application relates to silicone (polyorganosiloxane) rubber materials and to UV curable compositions for producing same.

One of the most outstanding characteristics of silicone rubber is the retention of virtually all desirable properties over a wide temperature range ($-100°$ to $315°$ C.), and over a long period at moderate temperature ($150°$ C). For example, silicone rubber has a useful life of up to 20 years at $120°$ C. and up to 5 years at $150°$ C.

The following are believed to be typical of heat vulcanized silicone rubber properties:

Mechanical properties: tensile strengths, 200–1500 psi; shore A hardness, 20–80; elongation up to 1000%; and tear strength, up to 150 lb./in.

Electrical properties: dielectric strength, 400–500 volts per mil; dielectric constant, 2.9–3.1 at frequencies of $10^2$–$10^{10}$ Hz; power factor $5\times10^3$ at $10^4$ Hz to $5\times10^{-2}$ at $10^9$ Hz; and volume resistivity, $10^{15}$ ohm-cm at $37°$ C. to $10^{12}$ ohm-cm at $260°$ C.

Miscellaneous: Silicone rubbers typically have good chemical, fuel and oil resistance. Water, in particular, virtually has no effect on them. They have excellent resistance to ozone, sunlight, oxygen and fungus, and display low toxicity and minimum tissue reaction in biological systems. They also have a very high thermal expansion coefficient ($2$–$3\times10^{-4}/°$C. for linear thermal expansion coefficient) and a high thermal conductivity (0.7 to 0.2 Cal/Sec/cm$^2$/cm/$°$C.).

The most common method of producing silicone rubbers with useful properties is by compounding gums of high molecular weight polyorganosiloxanes, filler, processing aids and peroxide curing agents and then curing at elevated temperature ($150°$ C. to about $250°$ C. depending on the peroxide). In order to obtain uniform rubbers, the gum, fillers, additives and peroxide have to be mixed thoroughly in banbury mixers and two-roll mills before they are oven-cured or steam-cured. Because of the extreme difficulty in processing these gums, they have no practical applications as sealants and adhesives. See W. Lynch, "Handbook of Silicone Rubber Fabrication," Van Nostrand Reinhold Co., NY, 1978.

On the other hand, room temperature vulcanizing silicone rubbers (RTV's) employ liquid low molecular weight polyorganosiloxanes, crosslinkers, fillers and catalysts. They are used as one part and two part systems. The one part system normally consists of a hydroxyl terminated polyorganosiloxane, triacetoxy or trimethoxy containing silanes as crosslinkers, organometallic catalysts and fillers. The curing is effected by moisture. The two part system comprises a silicon hydride crosslinker in one part, and a vinyl containing silicone, platinum catalysts, and fillers in the second part. Upon mixing the two parts, the curing takes place.

Both types of RTV's generally display the similar properties to the heat cured silicone gum rubbers. Their viscosities range from easily pourable liquids to thixotropic pastes, therefore, they are very useful as adhesives and sealants. However, a complete curing to form rubber usually takes several hours or even days at room temperature, although cure time can be reduced by using elevated temperatures. It is desirable therefore that silicon compositions, which may be easily processed and are capable of very rapid curing to tough silicone rubbers at or near room temperature, be developed.

Ultraviolet (UV) curing silicones containing methacrylate functional groups are known in the art. However, such art does not relate to the formation of silicone rubbers. GB No. 1323869 (1973) taught a composition of (a) an organopolysiloxane containing at least a (meth-)acrylate functional group; (2) a photosensitizer; and (3) a solvent for (1) and (2). The composition was intended for plate-making in printing, curing to a hard film, not suitable as a bulk rubber.

U.S. Pat. No. 4,201,808 taught a composition of (a) an organopolysiloxane containing an average of at least one acryloxy and/or methacryloxy group per molecule; (b) a low molecular weight polyacrylyl crosslinking agent; and (c) a photosensitizer. U.S. Pat. No. 4,348,454 also taught a similar composition. These compositions were taught for release coatings and were cured as a thin film by UV.

GB No. 2039287A taught a composition from the reaction of methacryloxypropyltrimethoxysilane and low molecular weight hydroxyl terminated polyorganosiloxanes. Again, this composition was cured as a thin film for protective coatings on paper, not as a bulk rubber.

SUMMARY OF THE INVENTION

The present inventors have developed novel silicone formulations which are capable of being rapidly cured by UV irradiation to tough elastomeric materials. Some of the inventive compositions have achieved performance approaching that of the most tear resistant silicone rubbers presently available. The cure is typically accomplished using a UV intensity of 70,000 microwatts/cm$^2$. The cured rubbers display typical silicone rubber properties including wide usable temperature range, and good water resistance.

The inventive compositions are pasty extrudable and spreadable materials which can be utilized as adhesives and sealants as well as molding compounds. One version of the inventive compositions employs certain silicones which are capable of undergoing both a rapid UV cure and a slower moisture cure in shadow areas. The compositions are particularly useful in preapplied gasketing applications, but are believed to be suitable for virtually any existing RTV silicone application which can accommodate a UV cure step.

The inventive compositions include as essential ingredients: a silicone resin having an average linear molecular size of at least about 150 siloxane units and having acrylic groups, as defined below, located at the ends of the polymer chains, at least about 10% of a reinforcing fumed silica filler; and a free radical initiator, preferably a photoinitiator. Other ingredients which may be added, depending on desired end properties, include adhesion promotors, limited amounts of non-acrylic silicones and other fillers such as iron oxide, barium zirconate and calcium carbonate.

DETAILED DESCRIPTION OF THE INVENTION

As used herein the term "acrylic group" is intended to refer to groups of the structure

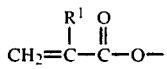

where $R^1$ is H or alkyl. Acrylate, methacrylate and ethacrylate groups are examples of such acrylic groups.

The polymer component of the inventive compositions is a silicone or blend of silicones which are characterized by terminal acrylic groups and an intermediate region free of acrylic functionality. The intermediate regions must include a minimum of about 150 linear

repeat units in order to give a material which will cure with the desired elastomeric properties.

Generally it is most convenient to utilize linear silicones in which the acrylic groups are linked to terminal silicone atoms. Such terminal acrylic silicones may be represented by the formula:

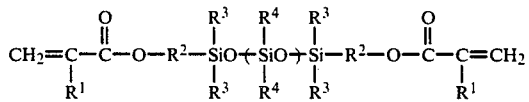

wherein $R^1$ is defined as above; the $R^2$ groups are divalent hydrocarbon or hydrocarbonoxy groups such as alkylene, alkyleneoxy, alkenylene or arylene groups; the $R^3$ groups are the same or different alkyl, substituted alkyl, aryl, substituted aryl, alkoxy aryloxy or acrylic groups; the $R^4$ groups are the same or different alkyl, substituted alkyl, aryl or substituted aryl groups and n is an integer between about 150 and 1200. Preferably $R^1$ is H or methyl. For thermal and hydrolytic stability of the silicon/acrylic group linkage, $R^2$ is preferably alkylene or alkenylene of 3-10 carbon atoms, such as propylene and propenylene. Examples of $R^3$ and $R^4$ groups are alkyls, such as methyl and ethyl; halo alkyls, such as trifluoropropyl; phenyl and benzyl. $R^3$ may also include moisture curable groups such as methoxy. Most preferably $R^3$ and $R^4$ are methyl.

A variety of synthetic groups may be employed to obtain the acrylated silicones useful in the invention. A method preferred for its simplicity is the reaction of dimethylchloromethacryloxypropylsilane with diethylamine, followed by condensation of the resulting amino silane with silanol terminated linear silicones to give corresponding dimethylmeth-acryloxypropylsilyl terminated silicones.

Dimethoxyacrylic terminated silicones capable of both moisture and UV cure, as disclosed in copending application Ser. No. 538,624, filed Oct. 3, 1983, now U.S. Pat. No. 4,528,081 may also be employed in the inventive compositions. The disclosure of Ser. No. 538,624 is incorporated herein by reference.

Other synthetic routes include hydrosilation of allyl methacrylate or allyloxyethyl methacrylate with silicon hydride terminated silicones. Hydrosilation of allyloxyethyl methacrylate with silicone hydride functional polymers is described in copending application Ser. No. 509,568, filed June 30, 1983, now abandoned, the disclosure of which is also incorporated herein by reference. Other hydrosilatable acrylic compounds include the olefinically unsaturated acrylic silane and siloxane grafting agents of copending application Ser. No. 515,702, filed July 20, 1983, now U.S. Pat. No. 4,504,629, the disclosure of which is also incorporated herein by reference.

Silicones having branched intermediate regions may also be advantageously used so long as branching does not result in a composition viscosity which is unworkable. However, if star polymers are used which have three or more branches terminating with acrylic functional end regions, as described above, the common central silicon atom serves to increase crosslink density of the cured polymer. Accordingly, the average size of each branch containing acrylic functionality should include the minimum number of linear repeat units (i.e. about 150 units) in order to obtain the desired elastomeric properties in the cured polymer.

The maximum molecular size of the acrylic silicones will vary according to the specific structure of the polymer and the type and amount of silica included in the composition. In general UV curing appears to be enhanced as silica levels are increased. Also, as molecular weight of an acrylic terminated linear dimethyl siloxane increases, the decreasing acrylic function density increases the difficulty of UV cure until the composition becomes uncurable with silicones above about 50,000 mw. For star polymers a maximum mol wt. is considered to be about 25,000/terminal acrylic group.

The second essential ingredient in the inventive compositions are reinforcing silicas. The reinforcing silicas are fumed silicas which may be untreated (hydrophilic) or treated so as to render them hydrophobic. The fumed silica should be present at a level of at least about 10% by weight of the composition in order to obtain any substantial reinforcing effect. Virtually any reinforcing of fumed silica fillers may be used. While optimal silica levels vary depending on the characteristics of the particular silica, it has generally been observed that the thixotropic effects of the silica produce compositions of impractically high viscosity before maximum reinforcing effect is reached. For some silicas, the optimal level may be 20%-50% or more. In choosing the silica level, therefore, desired reinforcement and practical viscosities must be balanced. In general, hydrophobic silicas display lower thixotropic ratios and therefore greater amounts can be included in a composition of desired consistency. Most preferred of the hydrophobic silicas is a hexamethyldisilazane treated silica sold by Wacker-Chemie under the number HDK H2000. This silica has a very low thixotropic ratio and may be incorporated into the compositions at levels in excess of 40%, producing cured products, having tear resistance in excess of 125 lb/in. In at least one such cured formulation a tear resistance of 170 lb/in has been obtained.

The photoinitiator utilized in the inventive compositions may be any photoinitiator known in the art to cause curing of acrylic functionalities. They include benzoin and substituted benzoins, benzophenone, Michler's ketone, dialkoxyacetophenones, such as diethoxyacetophenone, etc. Generally photoinitiator concentration will be in the range of 0.1%-5% by weight.

The photoinitiator may also be polymer bound. Such photoinitiators are described in copending applications, Ser. Nos. 505,588, and 528,287, filed June 20, 1983 and Aug. 31, 1983, now U.S. Pat. Nos. 4,477,326 and 4,587,276, respectively. Other free radical initiators, such as peroxy thermal initiators may be used in some of the lower molecular weight silicone formulations of the invention.

The compositions of the invention may also include other ingredients to modify the cured or uncured properties as desired for specific applications. For instance, adhesion promoters such as methacryloxypropyltrimethoxysilane, trialkylisocyanurate, etc., may be incorporated at levels up to about 5%. Other common silicone fillers such as iron oxide, barium zirconate and calcium carbonate, typically at levels of up to about 10% may also be included in the inventive compositions. Other optional ingredients are nonacrylic silicone diluents or plasticizers at levels of up to about 30%. The nonacrylic silicones include trimethylsilyl terminated oils of 100-500 cst viscosity and silicone gums. The non-acrylic silicones may include cocurable groups such as vinyl groups. However, the presence of such groups may adversely alter the crosslink density and architecture of the cured product.

The following examples are illustrative of the invention.

EXAMPLES 1-16

Compositions were prepared as indicated in Table I, where the numerical entries represent parts by weight. Silicone A is a linear methacrylate capped polydimethylsiloxane prepared by condensation of a 12,000 MW hydroxyl terminated polydimethylsiloxane with N,N-diethylaminomethacryloxypropyldimethylsilane. Silicone B is a linear methacrylate capped silicone similarly prepared from a 28,000 MW hydroxyl terminated polydimethylsiloxane. Silicone C is a 100,000 MW dimethylsilicone gum having 18% vinylmethyl siloxane units. Silica M is a hexamethyldisilazane treated silica sold by Wacker-Chemie under the name HDK H2000 TM. Silica N is an untreated fumed silica sold by Degussa under the name Aerosil 200 TM. Silica O is a low surface area dimethyldichlorosilane (DMCS) treated silica sold by Degussa under the name Aerosil R972 TM. Silica P is a high surface area DMCS treated silica sold by Degussa under the name Aerosil 974 TM.

Examples 13-16 are unfilled compositions, outside the present invention, provided for comparison.

To 98 parts of each composition were then added 2 parts diethoxyacetophenone. The compositions were then cast as 80 mil films and irradiated for 2 min./side with 70 mW/cm UV light from a medium pressure mercury vapor lamp. Tensile, Elongation, Tear and Shore A durometer hardness were then determined per ASTM D-412, D-412, D-624 and D-2240, respectively. Results are given in Table II.

TABLE I

| Example | Silicone A | Silicone B | Silicone C | Silica M | Silica N | Silica O | Silica P |
|---|---|---|---|---|---|---|---|
| 1 | 36 | 36 | 18 | — | 10 | — | — |
| 2 | 15.7 | 60.8 | 13.5 | — | 10 | — | — |
| 3 | 28 | 28 | 24 | 20 | — | — | — |
| 4 | — | 60 | — | 40 | — | — | — |
| 5 | 30 | 30 | — | 40 | — | — | — |
| 6 | 80 | — | — | — | — | 20 | — |
| 7 | 40 | 40 | — | — | — | 20 | — |
| 8 | 28 | 28 | 24 | — | — | 20 | — |
| 9 | 80 | — | — | — | — | — | 20 |
| 10 | 40 | 40 | — | — | — | — | 20 |
| 11 | — | 80 | — | — | — | — | 20 |
| 12 | 28 | 28 | 24 | — | — | — | 20 |
| 13 | 100 | — | — | — | — | — | — |
| 14 | 50 | 50 | — | — | — | — | — |
| 15 | — | 100 | — | — | — | — | — |
| 16 | 40 | 40 | 30 | — | — | — | — |

TABLE II

| Example | Tensile (psi) | Shore A | Elongation (%) | Tear (lb/in) |
|---|---|---|---|---|
| 1 | 203 | 39 | 130 | 13 |
| 2 | 214 | 37 | 160 | 16 |
| 3 | 201 | 41 | 90 | 18 |
| 4 | 327 | 30 | 800 | 149 |
| 5 | 548 | 50 | 490 | 170 |
| 6 | 298 | 42 | 152 | 51 |
| 7 | 215 | 41 | 182 | 56 |
| 8 | 507 | 57 | 77 | 26 |
| 9 | 216 | 51 | 151 | 53 |
| 10 | 288 | 54 | 171 | 61 |
| 11 | 292 | 34 | 550 | 87 |
| 12 | 271 | 62 | 58 | 28 |
| 13 | 22 | 10 | 79 | 4 |
| 14 | 28 | 15 | 218 | 5 |
| 15 | 5 | 0 | 800 | 3 |
| 16 | 31 | 12 | 134 | 4 |

An especially preferred class of acrylic terminated silicone polymers useful in the inventive compositions are derived from propargyl acrylate. Cured products in accordance with the invention using such silicones display exceptional heat aging resistance as indicated in Example 17.

EXAMPLE 17

Acryloxypropenyldimethylchlorosilane was prepared by a modification of Example 2 of U.S. Patent 3,746,734, to Berger et. al., using propargyl acrylate and dimethylchlorosilane as reactants. This product was then reacted with diethylamine. The resulting N,N-diethylaminoacryloxypropenyldimethylchlorosilane was then condensed with the 12000 MW and 28000 MW silanol terminated silicones utilized in Examples 1-16. The resulting acrylate terminated silicones were designated D and E, respectively.

To 98 parts of a composition comprising 40% silicone D, 40% silicone E and 20% Aerosil R974 were added 2 parts of diethoxyacetophenone photoinitiator. This formulation was then cast as 80 ml films and irradiated as in Examples 1-16 except that only 1 min/side irradiation pe side was required to give full cure.

Table III shows the results of tensile, elongation, tear resistance and Shore A hardness measurements for samples of this cured composition unaged and after 1 week, 2 weeks and 4 weeks exposure to a 350° F. oven. For comparison a formulation as in Example 10 was subjected to the same conditions except that a two min/side irradiation was used.

TABLE III

| | | Example 17 formulation | Example 10 formulation |
|---|---|---|---|
| Tensile (psi) | Unaged | 398 | 233 |
| | 1 wk | 552 | 218 |
| | 2 wks | 566 | 238 |
| | 4 wks | 536 | 252 |

TABLE III-continued

|  |  | Example 17 formulation | Example 10 formulation |
|---|---|---|---|
| Elongation | Unaged | 144 | 194 |
| (%) | 1 wk | 246 | 107 |
|  | 2 wks | 208 | 100 |
|  | 4 wks | 196 | 94 |
| Tear | Unaged | 54 | 64 |
| resistance | 1 wk | 57 | 55 |
| (lbs/in) | 2 wks | 51 | 53 |
|  | 4 wks | 48 | 50 |
| Shore A | Unaged | 55 | — |
| hardness | 1 wk | 58 | — |
|  | 2 wks | 61 | — |
|  | 4 wks | 66 | — |

From the foregoing it can be seen that many compositions within the scope of the present invention, as claimed below, can be formulated to produce a range of cured properties typical of silicone rubbers.

We claim:

1. A silicone composition curable by UV irradiation to an elastomer comprising:

(a) At least 56% by weight of a silicone resin or mixture of silicone resins represented by the formula:

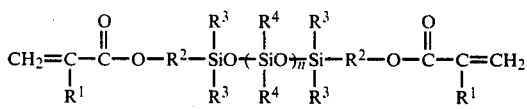

where $R^1$ is H or alkyl, the $R^2$ groups are divalent hydrocarbon or hydrocarbonoxy groups, the $R^3$ groups are the same or different alkyl, substituted alkyl, aryl, substituted aryl, alkoxy, or aryloxy groups; the $R^4$ groups are the same or different alkyl, halo substituted alkyl, or aryl groups and n is an integer between about 150 and 700;

(b) At least about 10% of a fumed silica filler; and (c) A photoinitiator.

2. A composition as in claim 1 wherein the $R^4$ groups are all methyl.

3. A composition as in claim 1 wherein said fumed silica filler is a hydrophobic silica.

4. A composition as in claim 1 wherein said fumed silica filler is present at a level of about 20% or more by weight.

5. A composition as in claim 4 wherein said fumed silica filler is a dimethyldichlorosilane or hexamethyldisilazane treated silica.

6. A composition as in claim 1 curable to an elastomer characterized by a tensile strength of at least 200 psi and a Shore A hardness of at least 20.

7. A composition as in claim 6 further characterized by a tear resistance of the cured elastomer in excess of 125 lb./in.

8. A composition as in claim 7 wherein the cured elastomer tear resistance is 170 lb./in. or more.

9. A composition as in claim 1 wherein the photoinitiator is present in the range of 0.1%-5% by weight.

10. A composition as in claim 1 wherein the photoinitiator is selected from benzoin, substituted benzoins, benzophenone, Michler's Ketone, and dialkoxyacetophenones.

11. A composition as in claim 1 wherein the photoinitiator is polymer bound.

12. A composition as in claim 1 wherein $R^1$ is H or $CH_3$, and $R^2$ is propylene or propenylene.

13. A composition as in claim 12 wherein $R^3$ and $R^4$ are methyl.

14. A cured composition as in claim 1.
15. A cured composition as in claim 4.
16. A cured composition as in claim 6.
17. A cured composition as in claim 7.
18. A cured composition as in claim 13.

19. A silicone composition curable to an elastomer comprising:

(a) At least 56% by weight of a silicone resin or mixture of resins represented by the formula:

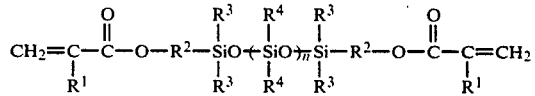

where $R^1$ is H or alkyl, the $R^2$ groups are divalent hydrocarbon or hydrocarbonoxy groups, the $R^3$ groups are the same or different alkyl, substituted alkyl, aryl, substituted aryl, alkoxy, or aryloxy groups; the $R^4$ groups are the same or different alkyl, halo substituted alkyl, or aryl groups and n is an integer between about 150 and 700;

(b) At least about 10% of a fumed silica filler; and
(c) A free radical initiator.

* * * * *